(12) United States Patent
Kumura et al.

(10) Patent No.: US 10,892,204 B2
(45) Date of Patent: Jan. 12, 2021

(54) ELECTROMAGNETIC WAVE ABSORBING HEAT CONDUCTIVE SHEET, METHOD FOR PRODUCING ELECTROMAGNETIC WAVE ABSORBING HEAT CONDUCTIVE SHEET, AND SEMICONDUCTOR DEVICE

(71) Applicant: Dexerials Corporation, Tokyo (JP)

(72) Inventors: Tatsuo Kumura, Tokyo (JP); Yusuke Kubo, Utsunomiya (JP); Keisuke Aramaki, Utsunomiya (JP); Hiroyuki Ryoson, Yokohama (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 16/085,263

(22) PCT Filed: Mar. 24, 2017

(86) PCT No.: PCT/JP2017/012155
§ 371 (c)(1),
(2) Date: Sep. 14, 2018

(87) PCT Pub. No.: WO2017/164406
PCT Pub. Date: Sep. 28, 2017

(65) Prior Publication Data
US 2019/0080978 A1 Mar. 14, 2019

(30) Foreign Application Priority Data
Mar. 25, 2016 (JP) .................... 2016-062335

(51) Int. Cl.
*H01L 23/36* (2006.01)
*H05K 9/00* (2006.01)
(Continued)

(52) U.S. Cl.
CPC ............ *H01L 23/36* (2013.01); *H01L 23/373* (2013.01); *H01L 23/3737* (2013.01);
(Continued)

(58) Field of Classification Search
CPC ....... H01L 23/36; H01L 23/42; H01L 23/552; H01L 23/373; H01L 23/3737;
(Continued)

(56) References Cited

U.S. PATENT DOCUMENTS

2006/0128895 A1* 6/2006 Aisenbrey ................. H01B 1/24
525/185
2014/0353848 A1* 12/2014 Park ........................ H01L 23/36
257/783

FOREIGN PATENT DOCUMENTS

CN 102971365 A 3/2013
CN 103959929 A 7/2014
(Continued)

OTHER PUBLICATIONS

Jun. 13, 2017, International Search Report issued in the International Patent Application No. PCT/JP2017/012155.
(Continued)

*Primary Examiner* — Cuong B Nguyen
(74) *Attorney, Agent, or Firm* — Kenja IP Law PC

(57) ABSTRACT

Disclosed is an electromagnetic wave absorbing heat conductive sheet having superior heat conductivity and electromagnetic wave absorbency. The electromagnetic wave absorbing heat conductive sheet comprises a polymer matrix component; a magnetic metal power; and a fibrous heat conductive filler oriented in one direction.

15 Claims, 5 Drawing Sheets

(51) Int. Cl.
  *H01L 23/42* (2006.01)
  *H01L 23/552* (2006.01)
  *H01L 23/373* (2006.01)
  *H05K 7/20* (2006.01)
  *H01L 23/28* (2006.01)

(52) U.S. Cl.
  CPC ............ *H01L 23/42* (2013.01); *H01L 23/552* (2013.01); *H05K 7/20209* (2013.01); *H05K 7/20481* (2013.01); *H05K 9/00* (2013.01); *H05K 9/009* (2013.01); *H05K 9/0083* (2013.01); *H01L 23/28* (2013.01)

(58) Field of Classification Search
  CPC ...... H01L 23/28; H05K 9/009; H05K 9/0083; H05K 7/20209; H05K 7/20481; H05K 9/00
  See application file for complete search history.

(56) References Cited

FOREIGN PATENT DOCUMENTS

| JP | 2001068312 A | 3/2001 |
|----|--------------|--------|
| JP | 2011134755 A | 7/2011 |
| JP | 2012023335 A | 2/2012 |
| JP | 5103780 B2   | 12/2012 |

OTHER PUBLICATIONS

May 8, 2018, Notification of Reasons for Refusal issued by the Japan Patent Office in the corresponding Japanese Patent Application No. 2016-062335.

Oct. 11, 2018, International Preliminary Report on Patentability issued in the International Patent Application No. PCT/JP2017/012155.

Jul. 24, 2018, Decision to Grant a Patent issued by the Japan Patent Office in the corresponding Japanese Patent Application No. 2018-127096.

Sep. 27, 2019, Office Action issued by the China National Intellectual Property Administration in the corresponding Chinese Patent Application No. 201780017965.3.

May 7, 2020, Office Action issued by the China National Intellectual Property Administration in the corresponding Chinese Patent Application No. 201780017965.3.

\* cited by examiner

ELECTROMAGNETIC WAVE ABSORBING HEAT CONDUCTIVE SHEET, METHOD FOR PRODUCING ELECTROMAGNETIC WAVE ABSORBING HEAT CONDUCTIVE SHEET, AND SEMICONDUCTOR DEVICE

TECHNICAL FIELD

The present disclosure relates to an electromagnetic wave absorbing heat conductive sheet having superior heat conductivity and electromagnetic wave absorbency, a method for producing the electromagnetic wave absorbing heat conductive sheet, and a semiconductor device.

BACKGROUND

In recent years, electronic devices are becoming smaller and smaller. However, as the power consumption amount cannot be changed so much owing to diverse applications, measures to dissipate heat inside the device have been increasingly considered important.

The heat dissipation measures for electronic devices widely utilize heat dissipation plates, heat pipes, heat sinks or other components which are made of metal material having high heat conductivity, such as copper or aluminum. To achieve a heat dissipation effect or temperature relaxation in the device, these heat dissipation components having superior heat conductivity are disposed in proximity to an electronic component such as a semiconductor package, a heat generator in the electronic device. Further, these heat dissipation components having superior heat conductivity are disposed from an electronic component, a heat generator, to a low-temperature place.

A heat generator in an electronic device is an electronic component such as a semiconductor device having a high current density and the fact that the current density is high is considered to mean that the electric field intensity or magnetic field strength, which can be a component of unnecessary radiation, is large. Thus, when a heat dissipation component made of metal is disposed in the vicinity of an electronic component, the heat dissipation component not only absorbs heat but undesirably receives harmonic components of electric signals flowing through the electronic component. Specifically, since the heat dissipation component is made of metal material, the component itself functions as an antenna of a harmonic component or serves as a transmission path of a harmonic noise component.

To address such a problem, techniques have been developed wherein magnetic material is added to a heat conductive sheet for the purpose of breaking the coupling of a magnetic field.

For example, PTL1 discloses an electromagnetic wave absorbing heat conductive sheet for use between a semiconductor such as a CPU and a heat sink, wherein a soft magnetic powder and a heat conductive filler are mixed with a silicone to attain electromagnetic wave absorption and heat conduction characteristics at the same time by means of a magnetic wave absorption effect of the soft magnetic powder and heat conductive characteristics of the heat conductive filler.

However, although a certain effect on electromagnetic wave absorption is observed with the technique of PTL1, the sheet shows heat conductivity in vertical direction of only around 1.5 W/(m·K), a level which is not sufficient to meet recent requirements for heat dissipation.

PTL2 discloses an electromagnetic wave interference suppression sheet containing fibrous conductive carbon and carbonyl iron, wherein the volume ratio of fibrous conductive carbon and carbonyl iron is set to 3-10:50-70 whereby the amount of electromagnetic wave absorption is increased while ensuring strength and flexibility of the sheet.

The technique of PTL2, however, has the drawback of making it impossible to provide a uniform sheet due to poor dispersion of fibrous conductive carbon when the fibrous conductive carbon content exceeds 10% by volume. Thus, PTL 2 does not pay sufficient consideration to heat conductivity.

PTL3 discloses a technique for suppressing electromagnetic noise and improving heat conductivity by the use of an electromagnetic wave interference suppression sheet which comprises carbon fiber and magnetic powder in a resin matrix.

However, while the technique of PTL3 can provide good heat conductivity, sufficient effects are not yet obtained in terms of suppression of electromagnetic noise; there has been an unmet demand for further improvements in view of practical use.

CITATION LIST

Patent Literature

[PTL 1] JP200168312A
[PTL 2] JP5103780B
[PTL 3] JP2011134755A

SUMMARY (Technical Problem)

The present disclosure was made in consideration of the foregoing circumstance in the art. An object of the present disclosure is to provide an electromagnetic wave absorbing heat conductive sheet having superior heat conductivity and electromagnetic wave absorbency and a method for producing the same. Another object of the present disclosure is to provide, with the use of the electromagnetic wave absorbing heat conductive sheet, a semiconductor device having superior heat dissipation and electromagnetic wave suppression.

(Solution to Problem)

The inventors made diligent studies to solve the foregoing problem. As a result, they found that higher heat conductivity and electromagnetic wave absorbency than conventional levels can be attained at the same time with the use of an electromagnetic wave absorbing heat conductive sheet which comprises a polymer matrix component, a fibrous heat conductive filler and a magnetic powder, wherein the fibrous heat conductive filler is oriented in one direction and the orientation direction is regulated.

The present disclosure was made based on the findings described above. The gist of the present disclosure is as follows:

(1) An electromagnetic wave absorbing heat conductive sheet, comprising:
   a polymer matrix component;
   a magnetic metal power; and
   a fibrous heat conductive filler oriented in one direction.
   With this configuration, it is possible to achieve superior heat conductivity and electromagnetic wave absorbency.

(2) The electromagnetic wave absorbing heat conductive sheet according to (1), wherein an angle of an orientation direction of the fibrous heat conductive filler relative to an extending direction of a sheet surface is in the range of more than 60° to 90°.

(3) The electromagnetic wave absorbing heat conductive sheet according to (1), wherein the electromagnetic wave absorbing heat conductive sheet has a heat conductivity in thickness direction of 5 W/(m·K) or more, a transmission absorption rate of the electromagnetic wave at 3 GHz of 30% or more, and a transmission absorption rate of the electromagnetic wave at 6 GHz of 70% or more.

(4) The electromagnetic wave absorbing heat conductive sheet according to (1), wherein an angle of an orientation direction of the fibrous heat conductive filler relative to an extending direction of a sheet surface is in the range of more than 30° to 60°.

(5) The electromagnetic wave absorbing heat conductive sheet according to (4), wherein the electromagnetic wave absorbing heat conductive sheet has a heat conductivity in thickness direction of 2.7 W/(m·K) or more, a transmission absorption rate of the electromagnetic wave at 3 GHz of 39% or more, and a transmission absorption rate of the electromagnetic wave at 6 GHz of 70% or more.

(6) The electromagnetic wave absorbing heat conductive sheet according to (1), wherein an angle of an orientation direction of the fibrous heat conductive filler relative to an extending direction of a sheet surface is in the range of 0° to 30°.

(7) The electromagnetic wave absorbing heat conductive sheet according to (6), wherein the electromagnetic wave absorbing heat conductive sheet has a heat conductivity in thickness direction of 1.5 W/(m·K) or more, a transmission absorption rate of the electromagnetic wave at 3 GHz of 68% or more, and a transmission absorption rate of the electromagnetic wave at 6 GHz of 70% or more.

(8) The electromagnetic wave absorbing heat conductive sheet according to any one of (1) to (7), wherein the electromagnetic wave absorbing heat conductive sheet comprises 4% to 40% by volume of the fibrous heat conductive filler and 35% to 75% by volume of the magnetic metal powder.

(9) The electromagnetic wave absorbing heat conductive sheet according to (8), wherein the electromagnetic wave absorbing heat conductive sheet comprises 5% to 30% by volume of the fibrous heat conductive filler and 40% to 65% by volume of the magnetic metal powder.

(10) The electromagnetic wave absorbing heat conductive sheet according to any one of (1)-(9), wherein the fibrous heat conductive filler is carbon fiber.

(11) The electromagnetic wave absorbing heat conductive sheet according to any one of (1)-(10), further comprising an inorganic filler.

(12) A method for producing an electromagnetic wave absorbing heat conductive sheet, comprising:
preparing a sheet composition which comprises a polymer matrix component, a fibrous heat conductive filler, and a magnetic metal power;
orientating the fibrous heat conductive filler;
producing a molded article for sheet by curing the polymer matrix component while keeping the fibrous heat conductive filler oriented; and
producing an electromagnetic wave absorbing heat conductive sheet by cutting the molded article for sheet at an angle of 0° to 90° relative to a longitudinal axis of the fibrous heat conductive filler oriented.

With this configuration, it is possible to provide an electromagnetic wave absorbing heat conductive sheet having superior heat conductivity and electromagnetic wave absorbency.

(13) The method according to (12), wherein orientating the fibrous heat conductive filler is carried out by extruding or injecting the sheet composition into a hollow mold under a high shearing force, and producing a molded article for sheet is carried out by thermal curing of the polymer matrix component.

(14) A semiconductor device, comprising:
a heat source;
a heat dissipation member; and
an electromagnetic wave absorbing heat conductive sheet held between the heat source and the heat dissipation member,
wherein the electromagnetic wave absorbing heat conductive sheet is the electromagnetic wave absorbing heat conductive sheet according to any one of (1)-(11).

With this configuration, it is possible to achieve superior heat dissipation and electromagnetic wave suppression.

(Advantageous Effect)

According to the present disclosure, it is possible to provide an electromagnetic wave absorbing heat conductive sheet having superior heat conductivity and electromagnetic wave absorbency and a method for producing the same. According to the present disclosure, it is also possible to provide, with the use of the electromagnetic wave absorbing heat conductive sheet, a semiconductor device having superior heat dissipation and electromagnetic wave suppression.

DETAILED DESCRIPTION

Figure 1:
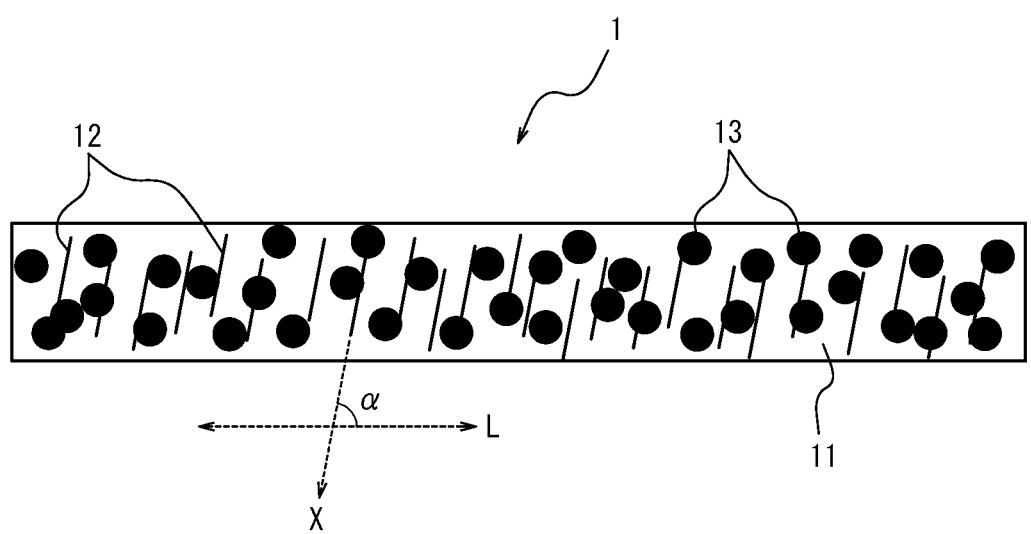
FIG. 1 is a schematic view of a cross-section in thickness direction of an electromagnetic wave absorbing heat conductive sheet according to an embodiment of the present disclosure.

Hereinafter, an example of an embodiment of the present disclosure will be described in detail.

<Electromagnetic Wave Absorbing Heat Conductive Sheet>

First, an electromagnetic wave absorbing heat conductive sheet of the present disclosure will be described.

The present disclosure is directed to an electromagnetic wave absorbing heat conductive sheet which comprises a polymer matrix component, a fibrous heat conductive filler, and a magnetic metal powder.

(Polymer Matrix Component)

The polymer matrix component contained in the electromagnetic wave absorbing heat conductive sheet of the present disclosure refers to a polymer component which serves as a base of the electromagnetic wave absorbing heat conductive sheet. The polymer matrix component can be of any type and can be selected as appropriate from those known in the art.

One exemplary polymer matrix component is thermosetting polymers.

Examples of thermosetting polymers include crosslinked rubbers, epoxy resins, polyimide resins, bismaleimide resins, benzocyclobutene resins, phenol resins, unsaturated polyesters, diallyl phthalate resins, silicones, polyurethanes, polyimide silicones, thermosetting polyphenylene ethers, and thermosetting modified polyphenylene ethers. These thermosetting polymers may be used alone or in combination.

Examples of crosslinked rubbers include natural rubber, butadiene rubber, isoprene rubber, nitrile rubber, hydrogenated nitrile rubber, chloroprene rubber, ethylene propylene rubber, chlorinated polyethylene, chlorosulfonated polyethylene, butyl rubber, halogenated butyl rubber, urethane rubber, acrylic rubber, polyisobutylene rubber, and silicone rubber. These crosslinked rubbers may be used alone or in combination.

Preferred among the thermosetting polymers are silicones for their superior moldability and weather resistance as well as from the perspective of adhesion and conformity to electronic components.

The silicones can be any silicone and any suitable type can be selected according to the purpose. From the perspective of obtaining moldability, weather resistance, adhesion etc., it is preferred that the silicones are those composed of liquid silicone gel as the main agent and of a curing agent. Examples of such silicones include addition reaction-curable liquid silicones, and thermally vulcanable millable silicones using peroxide for vulcanization. Particularly preferred for a heat dissipation member of an electronic device are addition reaction curable liquid silicones because adhesion between the heat generation surface of the electronic component and heat sink surface is required.

Preferred as the addition reaction-curable liquid silicones are, for example, two-component addition reaction-curable silicones in which a vinyl group-containing polyorganosiloxane is used as the main agent and a Si—H group-containing polyorganosiloxane is used as a curing agent.

In the combination of the liquid silicone gel as the main agent and the curing agent, the blending ratio of the main agent and the curing agent is preferably from 35:65 to 65:35 by mass.

The electromagnetic wave absorbing heat conductive sheet of the present disclosure can comprise any amount of the polymer matrix component and any suitable amount can be selected according to the purpose. From the perspective of ensuring moldability, adhesion etc. of the sheet, it is preferred that the polymer matrix component is contained in an amount of 30% to 40% by volume.

(Heat Conductive Filler)

The heat conductive filler contained in the electromagnetic wave absorbing heat conductive sheet of the present disclosure is a component for improving the heat conductivity of the sheet. The heat conductive filler can be of any type as long as it is a fibrous heat conductive filler, and can be selected as appropriate from those known in the art.

FIG. 1 is a schematic view of a cross-section in thickness direction of an electromagnetic wave absorbing heat conductive sheet of the present disclosure. As shown in FIG. 1, an electromagnetic wave absorbing heat conductive sheet 1 of the present disclosure is characterized in that 90% or more of fibers of a fibrous heat conductive filler 12 are oriented in one direction (direction X in FIG. 1).

As shown in FIG. 1, by orienting the fibrous heat conductive filler 12, in the electromagnetic wave absorbing heat conductive sheet 1, in addition to fibers of the fibrous heat conductive filler 12 being aligned in a regular manner, a magnetic metal powder 13 is uniformly dispersed in a regular manner. This allows the effects of the fibrous heat conductive filler 12 and the magnetic metal powder 13 to be more effectively exerted, so that high levels of heat conductivity and electromagnetic wave absorbency can be achieved.

The term "fibrous" in the fibrous heat conductive filler herein refers to a shape having a high aspect ratio (approximately 6 or more). Thus, the fibrous heat conductive filler herein encompasses not only fibrous and rod-shaped heat conductive fillers, but particulate heat conductive fillers having high aspect ratios, flaky heat conductive fillers, and so forth.

The fibrous heat conductive filler can be of any type as long as it is a fibrous, highly heat conductive material. Examples of materials include metals such as silver, copper and aluminum; ceramics such as alumina, aluminum nitride, silicon carbide, and graphite; and carbon fibers.

Preferred among such fibrous heat conductive fillers are carbon fibers for their capability of obtaining higher heat conductivity.

The heat conductive filler may comprise one type of heat conductive filler or may comprise a mixture of two or more different types of heat conductive fillers. When two or more different types of heat conductive fillers are used, each may be a fibrous heat conductive filler, or a fibrous heat conductive filler and heat conductive filler(s) of different shape may be mixed.

The carbon fibers can be of any type and any suitable carbon fiber can be selected according to the purpose. Examples of usable carbon fibers include pitch carbon fiber, PAN carbon fiber, graphitized PBO fiber, and those synthesized by arc discharging, laser evaporation, chemical vapor deposition (CVD), catalytic chemical vapor deposition (CCVD) or other techniques. More preferred among them are carbon fiber obtained by graphitizing PBO fiber and pitch carbon fiber for their capability of obtaining high heat conductivity.

Where necessary, the carbon fiber may be partially or entirely subjected to surface treatment prior to use. Surface treatments include oxidation, nitridization, nitration, sulfonation, and treatments wherein metals, metal compounds, organic compounds etc. are attached or bound to the functional groups introduced on the carbon fiber surface by such surface treatments or to the surface of the carbon fiber. Examples of functional groups include hydroxyl, carboxyl, carbonyl, nitro, and amino groups.

The carbon fiber can have any average fiber length (average major axis length) and any suitable average fiber length can be selected. To ensure high heat conductivity, it is preferred that the carbon fiber has an average fiber length of 50 µm to 300 µm, preferably 75 µm to 275 µm, and particularly preferably 90 µm to 250 µm.

The carbon fiber can also have any average fiber diameter (average minor axis length) and any suitable average fiber diameter can be selected. To ensure high heat conductivity, it is preferred that the carbon fiber has an average fiber diameter of 4 µm to 20 µm, and more preferably 5 µm to 14 µm.

The aspect ratio (average major axis length/average minor axis length) of the carbon fiber is preferably 6 or more, and more preferably 7 to 30, from the perspective of ensuring high heat conductivity. Although an effect of improving heat conductivity etc. can be seen even with small aspect ratios, the aspect ratio is preferably 6 or more because smaller aspect ratios cannot provide a high characteristics improvement effect due, for example, to reduction in orientation. On the other hand, aspect ratios of greater than 30 results in carbon fibers being less dispersed in the electromagnetic wave absorbing heat conductive sheet and this may result in failure to provide sufficient heat conductivity.

The average major axis length and average minor axis length of the carbon fiber can be measured with a microscope, a scanning electron microscope (SEM) or other device, and averages can be calculated from a plurality of samples.

The electromagnetic wave absorbing heat conductive sheet can comprise any amount of the fibrous heat conductive filler and a suitable amount can be selected as appropriate according to the purpose. It is preferred that the fibrous heat conductive filler is contained in an amount of 4% to 40% by volume, more preferably 5% to 30% by volume, and particularly preferably 6% to 20% by volume. When the fibrous heat conductive filler content is less than 4% by volume, it may become difficult to provide sufficiently low heat resistance. When the fibrous heat conductive filler content is greater than 40% by volume, it may undesirably affect the moldability of the heat conductive sheet and the orientation of the fibrous heat conductive filler.

In the electromagnetic wave absorbing heat conductive sheet 1, as shown in FIG. 1, the fibrous heat conductive filler 12 is oriented and its orientation direction X preferably forms a specific angle α relative to the extending direction L of the sheet surface. By adjusting the orientation direction X of the fibrous heat conductive filler 12 in the electromagnetic wave absorbing heat conductive sheet 1, it is possible to allow the electromagnetic wave absorbing heat conductive sheet 1 of the present disclosure to have higher levels of heat conductivity and/or electromagnetic wave absorbency.

As the name implies, the extending direction L of the sheet surface as used herein refers to a direction in which the surface of the electromagnetic wave absorbing heat conductive sheet 1 extends, and specifically refers to a direction along a cut surface of an electromagnetic wave absorbing heat conductive sheet cut out from a molded article for sheet described later, or a direction orthogonal to the cut surface.

It should be noted that fibers of the fibrous heat conductive filler 12 do not need to have exactly the same orientation direction X. In the present disclosure, orientation directions X within ±10° are regarded as orientation in one direction.

For example, setting the angle of the orientation direction X of the fibrous heat conductive filler 12 relative to the extending direction L of the sheet surface to fall within the range of more than 60° to 90° (angle α: more than 60° to)90° is preferred from the perspective that heat conductivity can be further improved.

When the angle of the orientation direction X of the fibrous heat conductive filler 12 relative to the extending direction L of the sheet surface falls within the range of more than 60° to 90°, the electromagnetic wave absorbing heat conductive sheet has a heat conductivity in thickness direction of 5 W/(m·K) or more, a transmission absorption rate of the electromagnetic wave at 3 GHz of 30% or more, and a transmission absorption rate of the electromagnetic wave at 6 GHz of 70% or more. The transmission absorption rate of the electromagnetic wave is a value measured by the microstrip line method using a 1 mm-thick electromagnetic wave absorbing heat conductive sheet cut into a 20 mm-diameter disc.

Further, setting the angle of the orientation direction X of the fibrous heat conductive filler 12 relative to the extending direction L of the sheet surface to fall within the range of more than 30° to 60° (angle α: more than 30° to)60° is preferred from the perspective that heat conductivity and electromagnetic wave absorbency can be improved in a well-balanced manner.

When the angle of the orientation direction X of the fibrous heat conductive filler 12 relative to the extending direction L of the sheet surface falls within the range of more than 30° to 60°, the electromagnetic wave absorbing heat conductive sheet has a heat conductivity in thickness direction of 2.7 W/(m·K) or more, a transmission absorption rate of the electromagnetic wave at 3 GHz of 39% or more, and a transmission absorption rate of the electromagnetic wave at 6 GHz of 70% or more. The transmission absorption rate of the electromagnetic wave is a value measured by the microstrip line method using a 1 mm-thick electromagnetic wave absorbing heat conductive sheet cut into a 20 mm-diameter disc.

For example, setting the angle of the orientation direction X of the fibrous heat conductive filler 12 relative to the extending direction L of the sheet surface to fall within the range of 0° to 30° (angle α: 0° to)30° is preferred from the perspective that electromagnetic wave absorbency can be greatly improved.

When the angle of the orientation direction X of the fibrous heat conductive filler 12 relative to the extending direction L of the sheet surface falls within the range of 0° to 30°, the electromagnetic wave absorbing heat conductive sheet has a heat conductivity in thickness direction of 1.5 W/(m·K) or more, a transmission absorption rate of the electromagnetic wave at 3 GHz of 68% or more, and a transmission absorption rate of the electromagnetic wave at 6 GHz of 70% or more. In this example, the electromagnetic wave absorbing heat conductive sheet shows low heat conductivity in thickness direction because the angle of the orientation direction X of the fibrous heat conductive filler 12 is small, but it functions as a heat spreader due to its high heat conductivity in in-plane direction. The transmission absorption rate of the electromagnetic wave is a value measured by the microstrip line method using a 1 mm-thick electromagnetic wave absorbing heat conductive sheet cut into a 20 mm-diameter disc.

Methods for changing the orientation direction X of the fibrous heat conductive filler 12 will be explained in detail later in the explanation of the method of the present disclosure for producing an electromagnetic wave absorbing heat conductive sheet. In brief, the orientation direction X of the fibrous heat conductive filler 12 can be adjusted by adjusting the cutting angle of a molded article for sheet from which the electromagnetic wave absorbing heat conductive sheet is produced, with the fibrous heat conductive filler 12 being oriented.

(Inorganic Filler)

The electromagnetic wave absorbing heat conductive sheet of the present disclosure preferably further comprises an inorganic filler because it is possible to enhance the heat conductivity of the electromagnetic wave absorbing heat conductive sheet and improve the strength of the sheet.

The inorganic filler can be of any shape, material, average particle diameter, etc. and any suitable shape, material, average particle diameter etc. can be selected according to the purpose. Examples of shapes include spherical, ellipsoidal, lumpy, granular, flattened, and acicular shapes. Preferred among them are spherical shape and ellipsoidal shape from the perspective of packing, with spherical shape being particularly preferred.

Materials of inorganic filler include aluminum nitride (AlN), silica, alumina (aluminum oxide), boron nitride, titania, glass, zinc oxide, silicon carbide, silicon, silicon oxide, aluminum oxide, and metal particles. These materials may be used alone or in combination. Preferred among them are alumina, boron nitride, aluminum nitride, zinc oxide and silica, with alumina and aluminum nitride being particularly preferred from the perspective of heat conductivity.

Surface-treated inorganic fillers can also be used. Inorganic fillers surface-treated with coupling agents show improved dispersibility and improve the flexibility of the heat conductive sheet.

The average particle diameter of the inorganic filler can be selected as appropriate depending on the type, etc. of the inorganic material used.

When alumina is used as the material of the inorganic filler, it is preferred that the average particle diameter is 1 μm to 10 μm, more preferably 1 μm to 5 μm, and particularly preferably 4 μm to 5 μm. When the average particle diameter is less than 1 μm, the viscosity may increase and make mixing difficult. When the average particle diameter is greater than 10 μm, the heat resistance of the heat conductive sheet may increase.

When aluminum nitride is used as the material of the inorganic filler, it is preferred that the average particle diameter is 0.3 μm to 6.0 μm, more preferably 0.3 μm to 2.0 μm, and particularly preferably 0.5 μm to 1.5 μm. When the average particle diameter is less than 0.3 μm, the viscosity may increase and make mixing difficult. When the average particle diameter is greater than 6.0 μm, the heat resistance of the heat conductive sheet may increase.

The average particle diameter of the inorganic filler can be measured for example using a particle size distribution meter or a scanning electron microscope (SEM).

(Magnetic Metal Powder)

The magnetic metal powder contained in the electromagnetic wave absorbing heat conductive sheet of the present disclosure is a component for improving the electromagnetic wave absorbency of the sheet.

The magnetic metal powder can be of any type so long as it has electromagnetic wave absorbency, and can be selected as appropriate from those known in the art. For example, amorphous metal powders and crystalline metal powders can be used. Examples of amorphous metal powders include Fe—Si—B—Cr, Fe—Si—B, Co—Si—B, Co—Zr, Co—Nb, and Co—Ta systems. Examples of crystalline metal powders include pure iron, and Fe, Co, Ni, Fe—Ni, Fe—Co, Fe—Al, Fe—Si, Fe—Si—Al and Fe—Ni—Si—Al systems. Also usable as crystalline metal powders are microcrystalline metal powders obtaining by micronizing crystalline powders added with trace amounts of nitrogen (N), carbon (C), oxygen (O), boron (B) or other element.

The magnetic metal powder may be a mixture of two or more different types of magnetic metal powders which are made of different materials or have different average particle diameters.

It is preferred to adjust the shape of the magnetic metal powder to have, for example, spherical or flattened shape. For example, when increasing packing of the magnetic metal powder, it is preferred to use a spherical magnetic powder having a particle diameter of several to several tens of micrometers. Such a magnetic metal powder can be produced for example by the atomization method or thermal decomposition of metal carbonyl. The atomization method has an advantage of easily making a spherical powder and involves flowing a molten metal out of a nozzle, blowing a jet stream of air, water, inert gas or the like to the molten metal flowed out from the nozzle to form liquid droplets, and solidifying the liquid droplets into powder form.

When producing an amorphous magnetic metal powder by the atomization method, it is preferred to set the cooling rate to about $10^6$ (K/s) so as to prevent crystallization of the molten metal.

When an amorphous alloy powder is produced by the atomization method, it is possible to smoothen the surface of the amorphous alloy powder. The use of such an amorphous alloy powder with less surface irregularity and small specific surface area as the magnetic metal powder can increase its packing within the binder resin. Further, coupling treatment further improves packing.

(Other Components)

In addition to the polymer matrix component, fibrous heat conductive filler, inorganic filler and magnetic metal powder described above, the electromagnetic wave absorbing heat conductive sheet of the present disclosure may also comprise other component(s) as appropriate according to the purpose.

Examples of other components include thixotropy agents, dispersing agents, cure accelerators, retarders, fine tackifiers, plasticizers, flame retardants, antioxidants, stabilizers, and coloring agents.

The electromagnetic wave absorbing heat conductive sheet of the present disclosure can be of any thickness and thickness can be changed as appropriate according to the place where it is used, for example. The thickness can range, for example, 0.2 mm to 5 mm in view of the adhesion and strength of the sheet.

<Method for Producing Electromagnetic Wave Absorbing Heat Conductive Sheet>

A method of the present disclosure for producing an electromagnetic wave absorbing heat conductive sheet will be described below.

The method of the present disclosure for producing an electromagnetic wave absorbing heat conductive sheet comprises the steps of:

preparing a sheet composition which comprises a polymer matrix component, a fibrous heat conductive filler, and a magnetic metal power (sheet composition preparing step);

orientating the fibrous heat conductive filler (filler orienting step); producing a molded article for sheet by curing the polymer matrix component while keeping the fibrous heat conductive filler oriented (step of producing molded article for sheet); and producing an electromagnetic wave absorbing heat conductive sheet by cutting the molded article for sheet at an angle of 0° to 90° relative to a longitudinal axis of the fibrous heat conductive filler oriented (step of producing electromagnetic wave absorbing heat conductive sheet).

The electromagnetic wave absorbing heat conductive sheet of the present disclosure can be obtained by the steps described above. As described above, the electromagnetic wave absorbing heat conductive sheet thus obtained shows superior heat conductivity and electromagnetic wave absorbency.

(Sheet Composition Preparing Step)

The method of the present disclosure for producing an electromagnetic wave absorbing heat conductive sheet comprises a sheet composition preparing step.

In this sheet composition preparing step, the polymer matrix component, fibrous heat conductive filler and magnetic metal power and optionally inorganic filler and/or other components described above are blended to prepare a sheet composition. These components can be blended through any procedure, e.g., the sheet composition is prepared by adding the fibrous heat conductive filler, magnetic metal power, inorganic filler and other components to the polymer matrix component and mixing these components.

(Filler Orientating Step)

The method of the present disclosure for producing an electromagnetic wave absorbing heat conductive sheet comprises a filler orientating step.

Any means can be used to orient the fibrous heat conductive filler so long as it is capable of orientating the fibrous heat conductive filler in one direction.

One exemplary method for orientating the fibrous heat conductive filler in one direction is to extrude or inject the sheet composition into a hollow mold under a high shearing force. This method allows fibers of the fibrous heat conductive filler to be relatively easily oriented and to have the same orientation direction (within ±10°).

Specific examples of the method described above for excluding or injecting the sheet composition into a hollow mold under a high shearing force include extrusion and mold casting.

When the sheet composition is extruded through a die by extrusion or when the composition is injected into a mold by mold casting, the binder resin flows and thereby carbon fibers orient along the flow direction. When a slit is attached to the tip of the die for extrusion, carbon fibers are more easily oriented.

The size and shape of the molded article (block of molded article) can be determined according to the required size of the electromagnetic wave absorbing heat conductive sheet. For example, the molded article can be a cuboid whose cross-section measures 0.5 cm to 15 cm in longitudinal direction and 0.5 cm to 15 cm in lateral direction. The length of the cuboid may be determined as appropriate.

(Step of Producing Molded Article for Sheet)

The method of the present disclosure for producing an electromagnetic wave absorbing heat conductive sheet comprises a step of producing a molded article for sheet.

The "molded article for sheet" herein refers to a sheet (molded article) from which the electromagnetic wave absorbing heat conductive sheet is obtained by cutting it into a given size. Manufacture of the molded article for sheet is carried out by curing the polymer matrix component while keeping the fibrous heat conductive filler oriented in the filler orienting step.

The method and conditions used to cure the polymer matrix component can be changed according to the type of the polymer matrix component used. For example, when the polymer matrix component is a thermosetting resin, the curing temperature of thermal curing can be adjusted. Further, when the thermosetting resin contains a liquid silicone gel as the main agent and a curing agent, it is preferred to carry out curing at a curing temperature of 80° C. to 120° C. Curing time for thermal curing is not particularly limited and can range 1 hour to 10 hours.

(Step of Producing Electromagnetic Wave Absorbing Heat Conductive Sheet)

The method of the present disclosure for producing an electromagnetic wave absorbing heat conductive sheet comprises a step of producing an electromagnetic wave absorbing heat conductive sheet.

Figure 2:
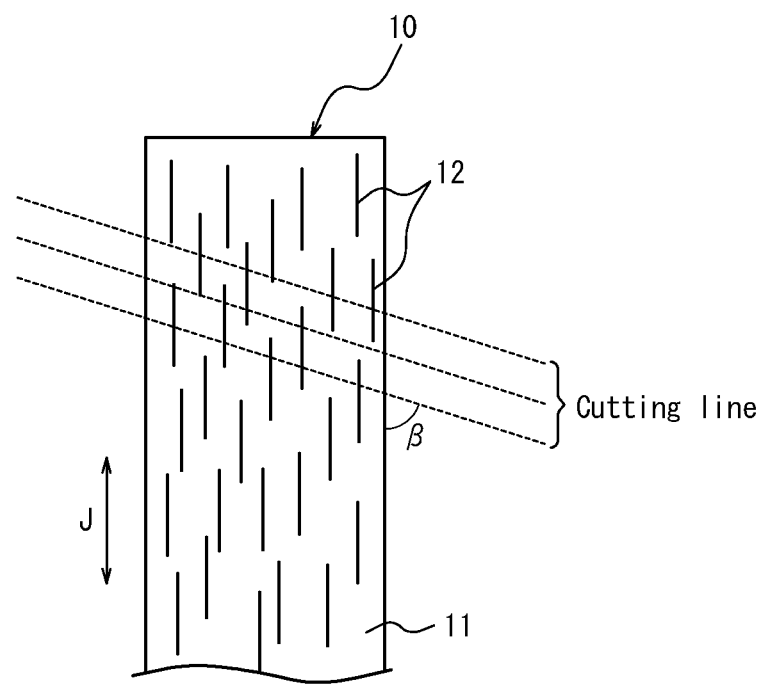
FIG. 2 is a schematic view of a state of a molded article for sheet to be cut in a step of producing an electromagnetic wave absorbing heat conductive sheet of the present disclosure.

In the step of producing an electromagnetic wave absorbing heat conductive sheet, as shown in FIG. 2, the molded article for sheet is cut such that the angle β relative to the longitudinal direction J of the oriented fibrous heat conductive filler 12 is 0° to 90°.

As shown in FIG. 2, a molded article for sheet 10 obtained in the step of producing a molded article for sheet is in a state where the longitudinal axis of each fiber of the fibrous heat conductive filer 12 is oriented in the constant direction J (for clarity, the magnetic metal powder 13 is not shown in FIG. 2). By cutting the molded article for sheet at a constant cutting angle relative to the longitudinal direction J of the carbon fiber 12, it is possible to obtain the electromagnetic wave absorbing heat conductive sheet 1 shown in FIG. 1. The cut surface of the molded article for sheet 10 shown in FIG. 2 corresponds to the sheet surface shown in FIG. 1.

The cutting angle β relative to the longitudinal direction J of the carbon fiber 12 can be adjusted as appropriate according to the orientation direction X (angle α relative to the extending direction of the sheet surface) of the carbon fiber 12 in the obtained electromagnetic wave absorbing heat conductive sheet 1.

For example, when the angle of orientation direction X of the carbon fiber 12 in the obtained electromagnetic wave absorbing heat conductive sheet 1 relative to the extending direction of the sheet surface is 30° (α=30°), the cutting angle β relative to the longitudinal direction J of the carbon fiber 12 may also be set to 30°.

Cutting of the molded article for sheet is carried out using a slicer. Any means can be used as the slicer as long as it is capable of cutting the molded article for sheet. Any of the slicers known in the art can be used as appropriate. For example, an ultrasonic cutter, a planer or the like can be used.

(Pressing Step)

The method of the present disclosure for producing an electromagnetic wave absorbing heat conductive sheet can further comprise a step of pressing the electromagnetic wave absorbing heat conductive sheet (pressing step) in order to smoothen the surface of the electromagnetic wave absorbing heat conductive sheet, increase adhesion, and reduce interfacial contact resistance under a light load.

Pressing can be carried out using, for example, a pair of pressing devices composed of a platen and a press head with flat surface. Alternatively, pinch rolls may be used for pressing.

The pressure during pressing can be at any level and can be selected as appropriate according to the purpose. However, when the pressure is too low, there is a tendency that heat resistance is the same as that when pressing is not carried out, and when the pressure is too high, there is a tendency that the sheet is elongated. It is thus preferred to set the pressure to fall within the range of 0.1 MPa to 100 MPa, and more preferably in the range of 0.5 MPa to 95 MPa.

<Semiconductor Device>

Next, a semiconductor device of the present disclosure will be described.

The semiconductor device of the present disclosure comprises a heat source, a heat dissipation member, and an electromagnetic wave absorbing heat conductive sheet held between the heat source and the heat dissipation member, wherein the electromagnetic wave absorbing heat conductive sheet is the electromagnetic wave absorbing heat conductive sheet of the present disclosure described above.

With the use of the electromagnetic wave absorbing heat conductive sheet of the present disclosure, the semiconductor device obtained shows a superior electromagnetic wave suppression effect while having high heat dissipation.

The heat source can be any component as long as it generates heat in the semiconductor device. Examples include electronic components such as CPUs, MPUs, graphic computing elements, and image sensors.

The heat dissipation member refers to an element which conducts heat generated from the heat source and dissipates it to the outside. Examples include radiators, coolers, heat sinks, heat spreaders, die pads, printed circuit boards, cooling fans, Peltier elements, heat pipes, metal covers, and casings.

Figure 3A:
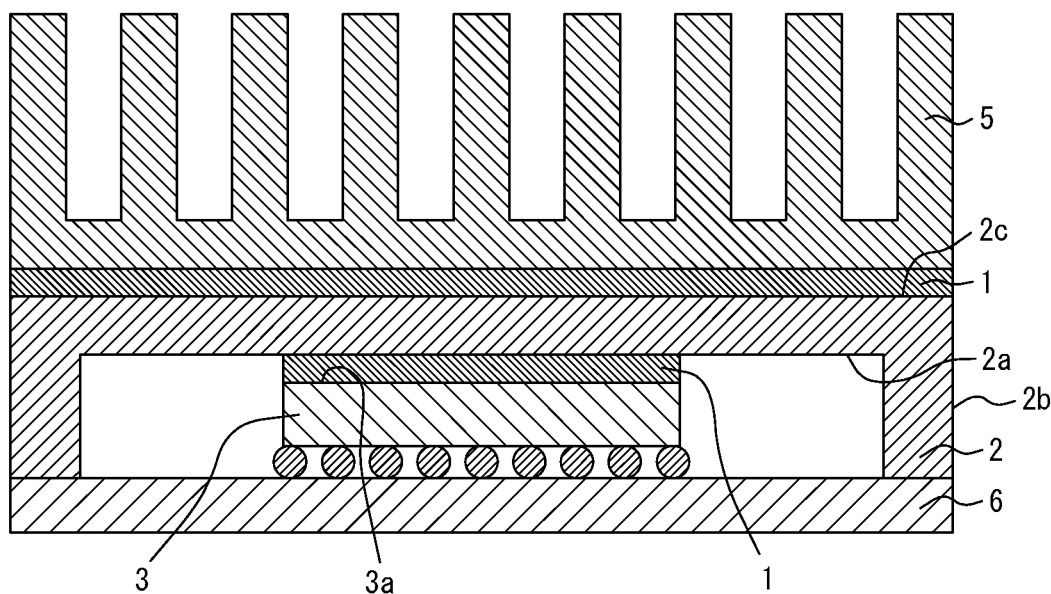
FIG. 3A is a schematic view of a semiconductor device according to an embodiment of the present disclosure.
Figure 3B:
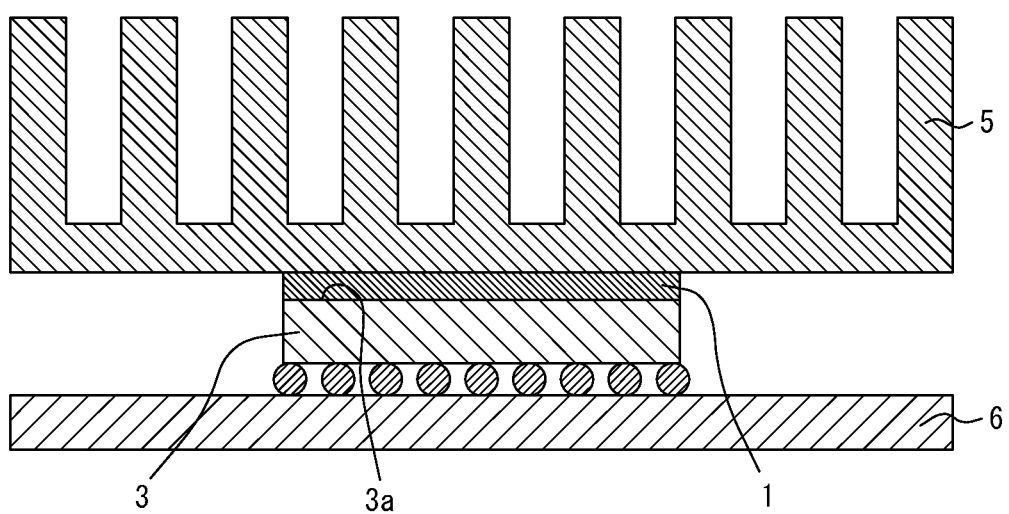
FIG. 3B is a schematic view of a semiconductor device according to another embodiment of the present disclosure.

Referring to FIGS. 3A and 3B, an example of the semiconductor device of the present disclosure will be described.

FIG. 3A is a schematic cross-sectional view of an example of a semiconductor device of the present disclosure. The semiconductor device comprises an electromagnetic wave absorbing heat conductive sheet 1, a heat spreader 2, an electronic component 3, a heat sink 5, and a wiring board 6.

The electromagnetic wave absorbing heat conductive sheet 1 not only absorbs unnecessary electromagnetic waves generated in the electronic component 3 and electromagnetic waves emitted from other components, but dissipates heat generated by the electronic component 3. As shown in FIG. 3A, the electromagnetic wave absorbing heat conductive sheet 1 is secured to a main surface 2a of the heat spreader 2 at a position facing the electronic component 3 and is held between the electronic component 3 and the heat spreader 2. Another electromagnetic wave absorbing heat conductive sheet 1 is held between the heat spreader 2 and the heat sink 5.

The heat spreader 2 is formed as a rectangular plate, for example, and comprises the main surface 2a facing the electronic component 3 and a side wall 2b running along the edge of the main surface 2a. The heat spreader 2 comprises the electromagnetic wave absorbing heat conductive sheet 1 provided on the main surface 2a surrounded by the side wall 2b and comprises the heat sink 5 provided, via the electromagnetic wave absorbing heat conductive sheet 1, on the other surface 2c which faces away from the main surface 2a. The heat spreader 2 can be formed of, for example, copper or aluminum, which shows good heat conductivity, because heat resistance decreases with increasing heat conductivity and therefore heat from the electronic component 3 such as a semiconductor device is effectively absorbed.

The electronic component 3 is, for example, a semiconductor package such as BGA and is mounted on the wiring board 6. The heat spreader 2 is also mounted on the wiring board 6 at the tip surface of the side wall 2b, whereby the heat spreader 2 surrounds the electronic component 3 by the side wall 2b at a predetermined distance.

With the electromagnetic wave absorbing heat conductive sheet 1 bonded to the main surface 2a of the heat spreader 2, the heat generated by the electronic component 3 is absorbed and dissipated from the heat sink 5. Bonding of the heat spreader 2 and the electromagnetic wave absorbing heat conductive sheet 1 can be effected by the adhesive force of the electromagnetic wave absorbing heat conductive sheet 1 itself.

FIG. 3B is a schematic cross-sectional view of another example of the semiconductor device of the present disclosure. The semiconductor device comprises an electromagnetic wave absorbing heat conductive sheet 1, a heat spreader 2, an electronic component 3, a heat sink 5, and a wiring board 6.

The electromagnetic wave absorbing heat conductive sheet 1 not only absorbs unnecessary electromagnetic waves generated in the electronic component 3 and electromagnetic waves emitted from other components, but dissipates heat generated by the electronic component 3. As shown in FIG. 3B, the electromagnetic wave absorbing heat conductive sheet 1 is secured to a top surface 3a of the electronic component 3 and is held between the electronic component 3 and the heat spreader 2.

EXAMPLES

Next, the present disclosure will be described more specifically based on Examples, which however shall not be construed as limiting the scope of the present disclosure.

Example 1

Fe—Si—B—Cr amorphous magnetic particles having an average particle diameter of 5 µm and pitch carbon fiber having an average fiber length of 200 µm ("Heat Conductive Fiber" manufactured by Nippon Graphite Fiber Co., Ltd.) were dispersed into a two-component addition reaction-curable liquid silicone at a two-component addition reaction-curable liquid silicone:amorphous magnetic particles: pitch carbon fiber ratio of 35 vol %:53 vol %:12 vol % to prepare a silicone composition (sheet composition).

The two-component addition reaction-liquid silicone is a blend of silicone A liquid (main agent) and silicone B liquid (curing agent) mixed at a ratio of 19:16. The obtained silicone composition was then extruded into a 30 mm×30 mm cuboidal mold having a release-coated PET film attached to the inner wall to form a silicone molded article, which was cured for 6 hours at 100° C. in an oven to afford a cured silicone product (molded article for sheet).

Next, with an ultrasonic cutter, the obtained silicone cured product was cut perpendicularly to the longitudinal axis of oriented carbon fibers, i.e. at a cutting angle β of 90° (orientation angle α: 90°) to afford a 1 mm-thick sample of an electromagnetic wave absorbing heat conductive sheet. The slicing speed of the ultrasonic cutter was 50 mm/sec. The ultrasonic vibration applied to the ultrasonic cutter had an oscillation frequency of 20.5 kHz and an amplitude of 60 µm.

Example 2

The cured silicone product was cut at a cutting angle β of 75° (orientation angle α: 75°) to afford a 1 mm-thick sample of an electromagnetic wave absorbing heat conductive sheet. The composition and the other steps are the same as those in Example 1.

Example 3

The cured silicone product was cut at a cutting angle β of 60° (orientation angle α: 60°) to afford a 1 mm-thick sample of an electromagnetic wave absorbing heat conductive sheet. The composition and the other steps are the same as those in Example 1.

Example 4

The cured silicone product was cut at a cutting angle β of 45° (orientation angle α: 45°) to afford a 1 mm-thick sample of an electromagnetic wave absorbing heat conductive sheet. The composition and the other steps are the same as those in Example 1.

Example 5

The cured silicone product was cut at a cutting angle β of 30° (orientation angle α: 30°) to afford a 1 mm-thick sample of an electromagnetic wave absorbing heat conductive sheet. The composition and the other steps are the same as those in Example 1.

Example 6

The cured silicone product was cut at a cutting angle β of 15° (orientation angle α: 15°) to afford a 1 mm-thick sample of an electromagnetic wave absorbing heat conductive sheet. The composition and the other steps are the same as those in Example 1.

Example 7

The cured silicone product was cut at a cutting angle β of 0° (orientation angle α: 0°) to afford a 1 mm-thick sample of an electromagnetic wave absorbing heat conductive sheet. The composition and the other steps are the same as those in Example 1.

Comparative Example 1

The cured silicone product was cut at a cutting angle of 90° (orientation angle α: 90°) to afford a 1 mm-thick sample of an electromagnetic wave absorbing heat conductive sheet. In this example, silica powder with an average particle diameter of 3-5 μm was used instead of the metal magnetic particles. Components were blended at a two-component addition reaction-curable liquid silicone:silica powder:pitch carbon fiber ratio of 35 vol %:53 vol %:12 vol % to prepare a silicone composition (sheet composition). The other steps are the same as those in Example 1.

Comparative Example 2

The cured silicone product was cut at a cutting angle of 45° (orientation angle α: 45°) to afford a 1 mm-thick sample of an electromagnetic wave absorbing heat conductive sheet. In this example, silica powder with an average particle diameter of 3-5 μm was used instead of the metal magnetic particles. Components were blended at a two-component addition reaction-curable liquid silicone:silica powder:pitch carbon fiber ratio of 35 vol %:53 vol %:12 vol % to prepare a silicone composition (sheet composition). The other steps are the same as those in Example 1.

Comparative Example 3

The cured silicone product was cut at a cutting angle of 0° (orientation angle α: 0°) to afford a 1 mm-thick sample of an electromagnetic wave absorbing heat conductive sheet. In this example, silica powder with an average particle diameter of 3-5 μm was used instead of the metal magnetic particles. Components were blended at a two-component addition reaction-curable liquid silicone:silica powder:pitch carbon fiber ratio of 35 vol %:53 vol %:12 vol % to prepare a silicone composition (sheet composition). The other steps are the same as those in Example 1.

Comparative Example 4

The cured silicone product was cut at a cutting angle of 0° (orientation angle α: 0°) to afford a 1 mm-thick sample of an electromagnetic wave absorbing heat conductive sheet. In this example, the electromagnetic wave absorbing heat conductive sheet was composed only of silicone and metal magnetic powder without including carbon fiber. The two-component addition reaction-curable liquid silicone and metal magnetic powder were blended at a two-component addition reaction-curable liquid silicone:metal magnetic powder ratio of 47 vol %:53 vol % to prepare a silicone composition (sheet composition). The other steps are the same as those in Example 1.

Comparative Example 5

Extrusion of the silicone composition into a mold was not carried out to produce a silicone molded article. Thus, carbon fibers in the obtained electromagnetic wave absorbing heat conductive sheet were not oriented in one direction. The other steps are the same as those in Example 1.

Comparative Example 6

Extrusion of the silicone composition into a mold was not carried out to produce a silicone molded article. Thus, carbon fibers in the obtained electromagnetic wave absorbing heat conductive sheet were not oriented in one direction. In this example, silica powder with an average particle diameter of 3-5 μm was used instead of the metal magnetic particles. Components were blended at a two-component addition reaction-curable liquid silicone:silica powder:pitch carbon fiber ratio of 35 vol %:53 vol %:12 vol % to prepare a silicone composition (sheet composition). The other steps are the same as those in Example 1.

Examples 8-11

The cured silicone product was cut at a cutting angle of 90° (orientation angle α: 90°) to afford a 1 mm-thick sample of an electromagnetic wave absorbing heat conductive sheet. Components were blended at a two-component addition reaction-curable liquid silicone:amorphous magnetic particles:pitch carbon fiber ratio as shown in Table 2. The other steps are the same as those in Example 1.

Examples 12-15

The cured silicone product was cut at a cutting angle of 45° (orientation angle α: 45°) to afford a 1 mm-thick sample of an electromagnetic wave absorbing heat conductive sheet. Components were blended at a two-component addition reaction-curable liquid silicone:amorphous magnetic particles:pitch carbon fiber ratio as shown in Table 2. The other steps are the same as those in Example 1.

Examples 16-19

The cured silicone product was cut at a cutting angle of 0° (orientation angle α: 0°) to afford a 1 mm-thick sample of an electromagnetic wave absorbing heat conductive sheet. Components were blended at a two-component addition reaction-curable liquid silicone:amorphous magnetic particles:pitch carbon fiber ratio as shown in Table 2. The other steps are the same as those in Example 1.

(Evaluations)

Samples of the electromagnetic wave absorbing heat conductive sheets obtained above were evaluated as described below. The evaluation results are shown in Table 1.

(1) Heat Conductivity

Each sample was cut into a 20 mm-diameter disc and measured for heat resistance. The heat resistance of each electromagnetic wave absorbing heat conductive sheet was measured using a heat conductivity meter (Sony Corporation) in accordance with ASTM D 5470 under a load of 1.5 kgf/cm². From the measured value, heat conductivity was calculated. The results are shown in Table 1 and Table 2.

(2) Transmission absorption rate of the electromagnetic wave

Figure 7:
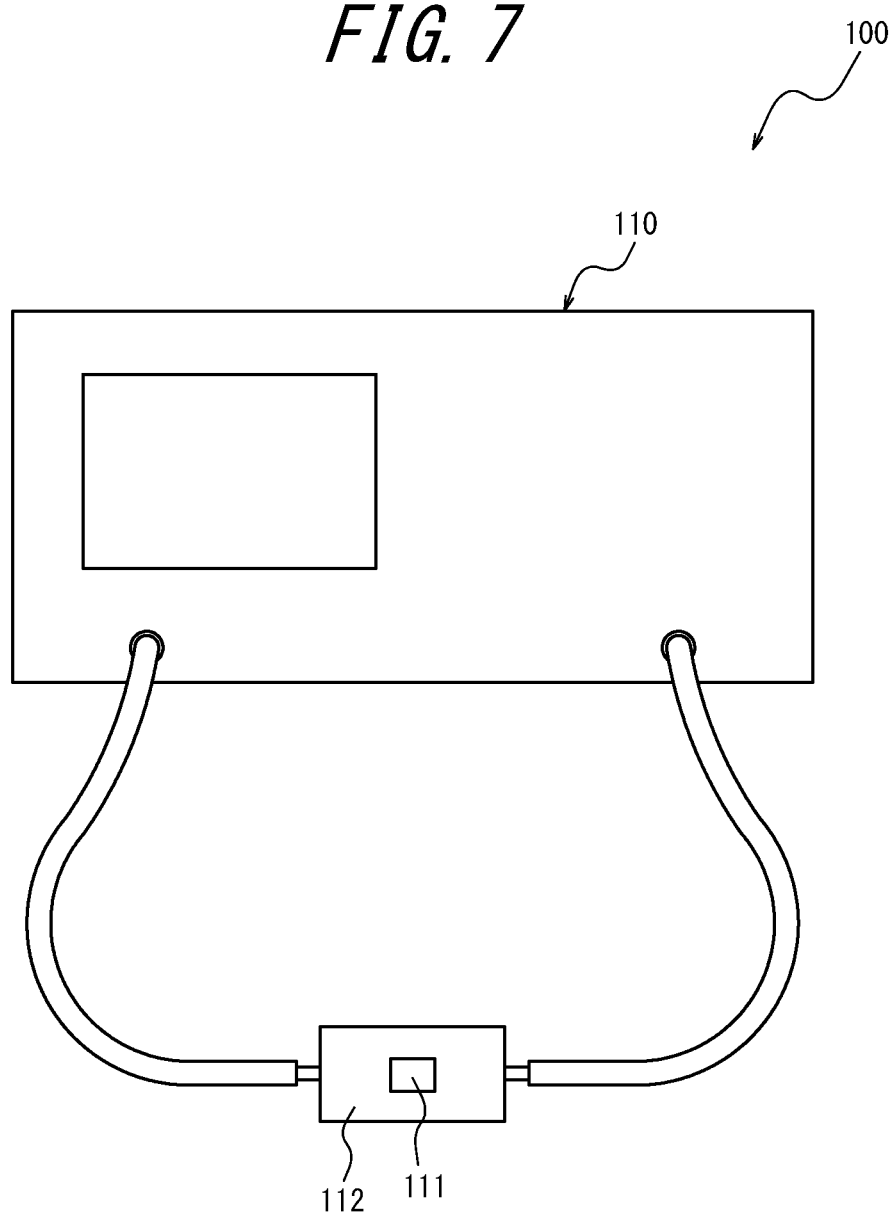
FIG. 7 shows a measurement system used for measuring the transmission absorption rate of the electromagnetic wave (%).

The microstrip line method specified in IEC 62333-2 was used. A measurement system 100 was as shown in FIG. 7 and a reflection signal (S11) and a transmission signal (S21) were measured by a network analyzer 110. A microstrip line 112 is formed having a width of 4 mm on the surface of a dielectric substrate (copper on the backside) of 100 mm×100 mm×1.6 mm and adjusted to have a characteristic impedance of 50Ω. Each sample 111 was cut out into a 20 mm-diameter disc, attached to the central portion of the microstrip line, S11 and S21 were measured, and the transmission absorption rate of the electromagnetic wave was calculated.

Upon calculation, loss in the absence of the electromagnetic wave absorbing heat conductive sheet was subtracted from the measured value to calculate the transmission absorption rate of the electromagnetic wave that reflects the net effect of the electromagnetic wave absorbing heat conductive sheet on transmission absorption. Values at 1, 3 and 6 GHz were extracted and shown in Tables 1 and 2.

Figure 4:
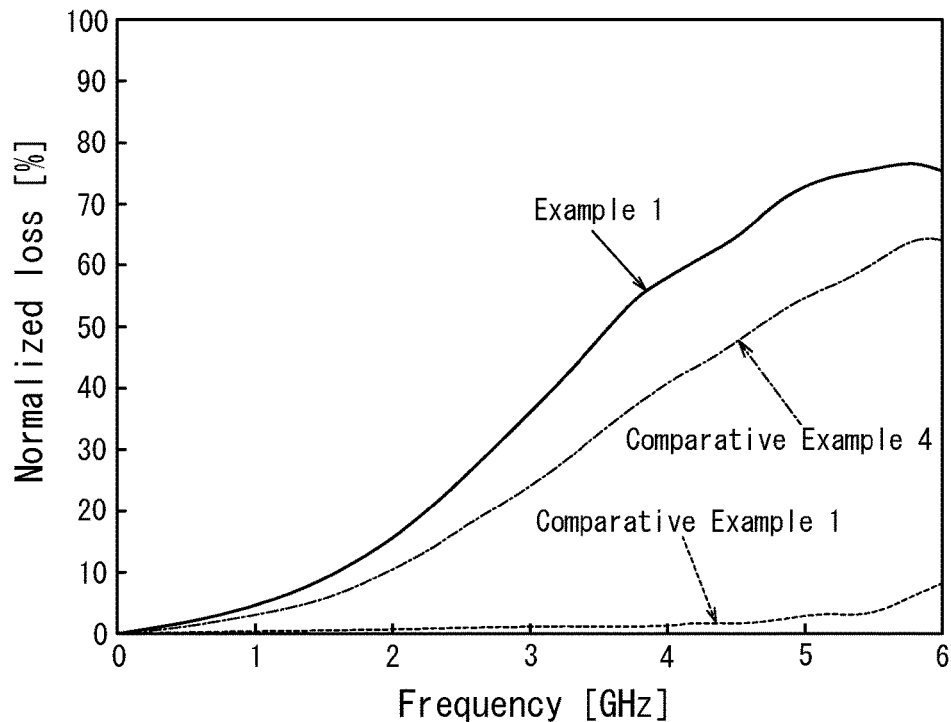
FIG. 4 shows plots of transmission absorption rate of the electromagnetic wave (%) versus frequency for Example 1, Comparative Example 4 and Comparative Example 1.
Figure 5:
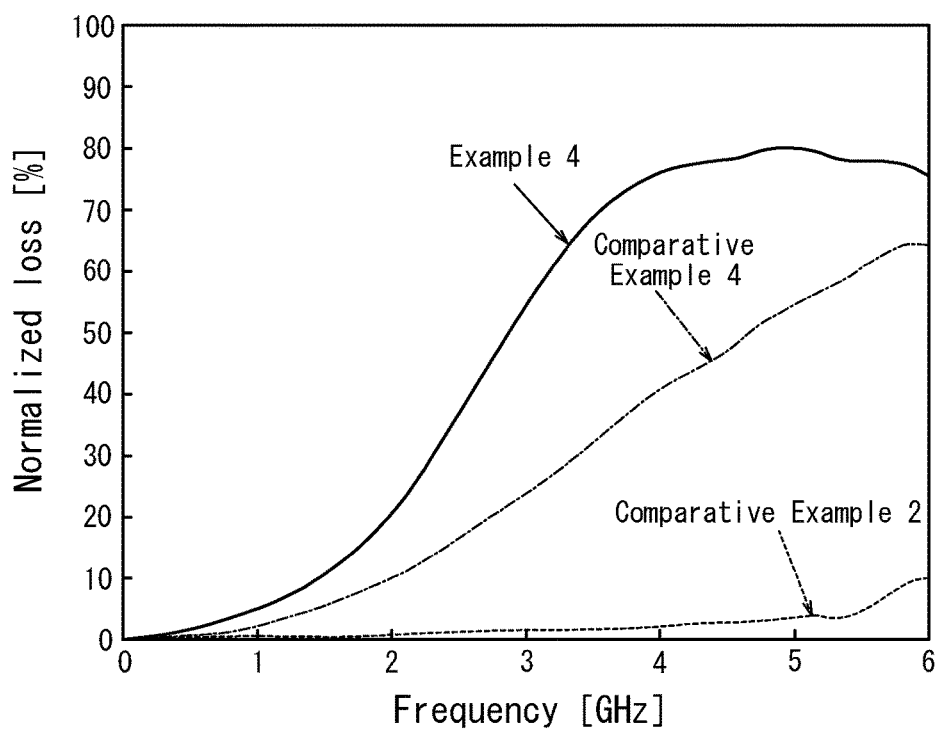
FIG. 5 shows plots of transmission absorption rate of the electromagnetic wave (%) versus frequency for Example 4, Comparative Example 4 and Comparative Example 2.
Figure 6:
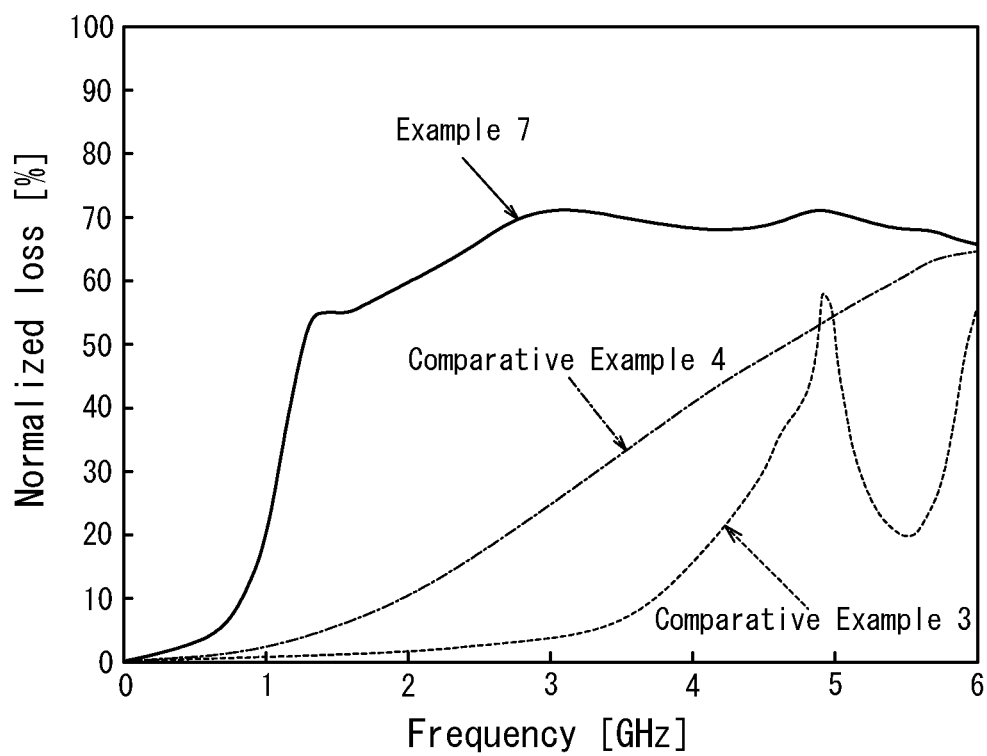
FIG. 6 shows plots of transmission absorption rate of the electromagnetic wave (%) versus frequency for Example 7, Comparative Example 4 and Comparative Example 3.

Plots of transmission absorption rate of the electromagnetic wave (%) versus frequency for Example 1, Comparative Example 4 and Comparative Example 1 are shown in FIG. 4; plots of transmission absorption rate of the electromagnetic wave (%) versus frequency for Example 4, Comparative Example 4 and Comparative Example 2 in FIG. 5; and plots of transmission absorption rate of the electromagnetic wave (%) versus frequency for Example 7, Comparative Example 4 and Comparative Example 3 in FIG. 6.

TABLE 1

| | Carbon fiber content (vol %) | Magnetic substance content (vol %) | Heat conductive filler content (vol %) | Carbon fiber orientation angle α (deg) | Evaluations Heat conductivity (W/m·K) | Transmission absorption rate (%) 1 GHz | 3 GHz | 6 GHz |
|---|---|---|---|---|---|---|---|---|
| Ex. 1 | 12 | 53 | 0 | 90 | 8.6 | 3.9 | 35.8 | 76.1 |
| Ex. 2 | 12 | 53 | 0 | 75 | 6.3 | 3.6 | 39.3 | 76.5 |
| Ex. 3 | 12 | 53 | 0 | 60 | 5.3 | 3.8 | 39.7 | 77.6 |
| Ex. 4 | 12 | 53 | 0 | 45 | 3.8 | 4.2 | 51.1 | 75.8 |
| Ex. 5 | 12 | 53 | 0 | 30 | 2.7 | 4.8 | 68.4 | 70.5 |
| Ex. 6 | 12 | 53 | 0 | 15 | 2.1 | 5.3 | 68.0 | 72.4 |
| Ex. 7 | 12 | 53 | 0 | 0 | 1.5 | 11.3 | 69.6 | 65.8 |
| Comp. Ex. 1 | 12 | 0 | 53 | 90 | 6.7 | 0.5 | 1.4 | 6.9 |
| Comp. Ex. 2 | 12 | 0 | 53 | 45 | 3.5 | 1.0 | 2.0 | 9.8 |
| Comp. Ex. 3 | 12 | 0 | 53 | 0 | 1.7 | 1.3 | 3.8 | 53.2 |
| Comp. Ex. 4 | 0 | 53 | 0 | — | 0.9 | 2.6 | 24.0 | 64.5 |
| Comp. Ex. 5 | 12 | 53 | 0 | Not oriented | 2.0-3.1 | 7.1 | 77.0 | 72.2 |
| Comp. Ex. 6 | 12 | 0 | 53 | Not oriented | 2.2-2.6 | 1.0 | 2.1 | 34.7 |

TABLE 2

| | Carbon fiber content (vol %) | Magnetic substance content (vol %) | Heat conductive filler content (vol %) | Carbon fiber orientation angle α (deg) | Evaluations Heat conductivity (W/m·K) | Transmission absorption rate (%) 1 GHz | 3 GHz | 6 GHz |
|---|---|---|---|---|---|---|---|---|
| Ex. 8 | 6 | 62 | 0 | 90 | 5.47 | 3.6 | 31.9 | 70.5 |
| Ex. 9 | 8 | 59 | 0 | 90 | 6.2 | 4 | 33.1 | 76.1 |
| Ex. 1 | 12 | 53 | 0 | 90 | 8.57 | 3.9 | 35.8 | 76.1 |
| Ex. 10 | 16 | 47 | 0 | 90 | 10.2 | 3.8 | 34.4 | 77.2 |
| Ex. 11 | 18 | 44 | 0 | 90 | 11.8 | 3.9 | 35.8 | 78.1 |
| Ex. 12 | 6 | 62 | 0 | 45 | 3.11 | 4.6 | 42.3 | 78.5 |
| Ex. 13 | 8 | 59 | 0 | 45 | 3.33 | 5.1 | 50.6 | 73.5 |
| Ex. 4 | 12 | 53 | 0 | 45 | 3.76 | 4.2 | 51.1 | 75.8 |
| Ex. 14 | 16 | 47 | 0 | 45 | 4.51 | 4.4 | 50.3 | 76.2 |
| Ex. 15 | 18 | 44 | 0 | 45 | 4.72 | 5.2 | 49.6 | 75.3 |
| Ex. 16 | 6 | 59 | 0 | 0 | 1.53 | 5 | 82 | 72.8 |
| Ex. 17 | 8 | 57 | 0 | 0 | 1.5 | 5.5 | 66.3 | 70.3 |
| Ex. 7 | 12 | 53 | 0 | 0 | 1.46 | 11.3 | 69.6 | 65.8 |
| Ex. 18 | 16 | 47 | 0 | 0 | 1.62 | 7.2 | 72.5 | 75.7 |
| Ex. 19 | 18 | 44 | 0 | 0 | 1.7 | 5.4 | 79.8 | 74.3 |

Referring to the results shown in Table 1, Examples 1 and 2 showed high heat conductivity of greater than 6 W/(m·K) as well as superior transmission absorption characteristics particularly at high frequencies, with a transmission absorption rate of the electromagnetic wave at 3 GHz of greater than 35% and a transmission absorption rate of the electromagnetic wave at 6 GHz of greater than 76%. Examples 3 and 4 showed relatively high heat conductivity of 3.8 W/(m·K) or more as well as improved transmission absorption characteristics at slightly lower frequencies, with a transmission absorption rate of the electromagnetic wave at 3 GHz of about 40% or more and a transmission absorption rate of the electromagnetic wave at 6 GHz of greater than 75%. Examples 5 to 7 showed slightly low heat conductivity of 2.7 to 1.5 W/(m·K) but particularly superior transmission absorption characteristics, with a transmission absorption rate of the electromagnetic wave of about 5 or more even at 1 GHz and a transmission absorption rate of the electromagnetic wave of about 70% or more at 3 GHz and higher frequencies.

Thus, it was found that Examples 1 to 7 provided superior heat conductivity and superior transmission absorption rate of the electromagnetic wave and further that it is possible to set heat conductivity and transmission absorption rate of the electromagnetic wave in a properly balanced manner by means of the orientation angle of carbon fibers.

In contrast, referring to the results of Comparative Examples, Comparative Examples 1 and 2 where only carbon fiber and silica were used without magnetic substance showed significantly low transmission absorption rate of the electromagnetic wave and Comparative Example 3 showed both low heat conductivity and low transmission absorption rate of the electromagnetic wave. Comparative Example 4 where only magnetic substance was used showed significantly low heat conductivity. Comparative Examples 5 and 6 where carbon fibers were not subjected to orientation showed inferior heat conductivity compared to Example 1 and Comparative Example 1, which used the same conditions as Examples 5 and 6, respectively, except that carbon fibers or heat conductive filler were not oriented.

Table 2 shows characteristics values of heat conductivity and transmission absorption rate of the electromagnetic wave for different carbon fiber contents and magnetic substance contents at a carbon fiber orientation angle of 90°, 45° or 0°. It was found that adjustment of the carbon fiber content and magnetic substance content together with the orientation angle of carbon fibers makes it possible to set various characteristics values of heat conductivity and transmission absorption rate of the electromagnetic wave.

FIGS. 4 to 6 compare transmission absorption rate of the electromagnetic wave-frequency characteristics. It was found that Examples, where both carbon fiber and magnetic substance were present, showed superior transmission absorption rate of the electromagnetic wave by their synergetic effect at every orientation angle α of the carbon fiber compared to Comparative Examples where only carbon fiber or magnetic substance was used.

INDUSTRIAL APPLICABILITY

According to the present disclosure, it is possible to provide an electromagnetic wave absorbing heat conductive sheet having superior heat conductivity and electromagnetic wave absorbency and a method for producing the same. According to the present disclosure, it is also possible to provide, with the use of the electromagnetic wave absorbing heat conductive sheet, a semiconductor device having superior heat dissipation and electromagnetic wave suppression.

REFERENCE SIGNS LIST

1 Electromagnetic wave absorbing heat conductive sheet
2 Heat spreader
2a Main surface
2b Side wall
2c Other side
3 Electronic component
3a Top surface
5 Heat sink
6 Wiring board
10 Electromagnetic wave absorbing heat conductive sheet
11 Polymer matrix component
12 Carbon fiber
13 Magnetic metal powder
100 Measurement system
110 Network analyzer
111 Sample of electromagnetic wave absorbing heat conductive sheet
112 Microstrip line

The invention claimed is:

1. An electromagnetic wave absorbing heat conductive sheet, comprising:
a polymer matrix component;
a magnetic metal powder; and
fibrous heat conductive fillers,
wherein 90% or more of the fibrous heat conductive fillers are oriented in one direction,
an angle of an orientation direction of the oriented fillers relative to an extending direction of a sheet surface is in the range of more than 60° to 90°,
and
the electromagnetic wave absorbing heat conductive sheet satisfies condition of (a), (b) or (c):
(a) a heat conductivity in thickness direction of 5 W/(m·K) or more and a transmission absorption rate of the electromagnetic wave at 1 GHz of 3.6% or more,
(b) a heat conductivity in thickness direction of 5 W/(m·K) or more and a transmission absorption rate of the electromagnetic wave at 3 GHz of 30% or more,
(c) a heat conductivity in thickness direction of 5 W/(m·K) or more and a transmission absorption rate of the electromagnetic wave at 6 GHz of 70% or more.

2. The electromagnetic wave absorbing heat conductive sheet according to claim 1, wherein the electromagnetic wave absorbing heat conductive sheet comprises 4% to 40% by volume of the fibrous heat conductive fillers and 35% to 75% by volume of the magnetic metal powder.

3. The electromagnetic wave absorbing heat conductive sheet according to claim 2, wherein the electromagnetic wave absorbing heat conductive sheet comprises 5% to 30% by volume of the oriented fillers and 40% to 65% by volume of the magnetic metal powder.

4. The electromagnetic wave absorbing heat conductive sheet according to claim 1, wherein the fibrous heat conductive fillers are carbon fiber.

5. The electromagnetic wave absorbing heat conductive sheet according to claim 1, further comprising an inorganic filler.

6. A method for producing the electromagnetic wave absorbing heat conductive sheet according to claim 1, the method comprising:

preparing a sheet composition which comprises the polymer matrix component, the fibrous heat conductive fillers, and the magnetic metal powder;

orientating 90% or more of the fibrous heat conductive fillers in one direction;

producing a molded article for sheet by curing the polymer matrix component while keeping the fibrous heat conductive fillers oriented; and producing an electromagnetic wave absorbing heat conductive sheet by cutting the molded article for sheet at an angle of more than 60° to 90° relative to a longitudinal axis of the fibrous heat conductive fillers oriented.

7. A semiconductor device, comprising:
a heat source;
a heat dissipation member; and
the electromagnetic wave absorbing heat conductive sheet according to claim 1, the electromagnetic wave absorbing heat conductive sheet being held between the heat source and the heat dissipation member.

8. The electromagnetic wave absorbing heat conductive sheet according to claim 4, wherein the carbon fiber has an average fiber length of 50 μm to 300 μm.

9. The electromagnetic wave absorbing heat conductive sheet according to claim 4, wherein the carbon fiber has an aspect ratio of 7 to 30.

10. An electromagnetic wave absorbing heat conductive sheet, comprising:
a polymer matrix component;
a magnetic metal powder; and
fibrous heat conductive fillers,
wherein 90% or more of the fibrous heat conductive fillers are oriented in one direction,
an angle of an orientation direction of the oriented fillers relative to an extending direction of a sheet surface is in the range of more than 30° to 60°, and
the electromagnetic wave absorbing heat conductive sheet satisfies condition of (a), (b) or (c):
(a) a heat conductivity in thickness direction of 2.7 W/(m·K) or more and a transmission absorption rate of the electromagnetic wave at 1 GHz of 3.8% or more,
(b) a heat conductivity in thickness direction of 2.7 W/(m·K) or more and a transmission absorption rate of the electromagnetic wave at 3 GHz of 39% or more,
(c) a heat conductivity in thickness direction of 2.7 W/(m·K) or more and a transmission absorption rate of the electromagnetic wave at 6 GHz of 70% or more.

11. A method for producing the electromagnetic wave absorbing heat conductive sheet according to claim 10 comprising:
preparing a sheet composition which comprises the polymer matrix component, the fibrous heat conductive fillers, and the magnetic metal powder;
orientating 90% or more of the fibrous heat conductive fillers in one direction;
producing a molded article for sheet by curing the polymer matrix component while keeping the fibrous heat conductive fillers oriented; and
producing an electromagnetic wave absorbing heat conductive sheet by cutting the molded article for sheet at an angle of more than 30° to 60° relative to a longitudinal axis of the fibrous heat conductive fillers oriented.

12. A semiconductor device, comprising:
a heat source;
a heat dissipation member; and
an electromagnetic wave absorbing heat conductive sheet held between the heat source and the heat dissipation member,
wherein the electromagnetic wave absorbing heat conductive sheet is the electromagnetic wave absorbing heat conductive sheet according to claim 10.

13. An electromagnetic wave absorbing heat conductive sheet, comprising:
a polymer matrix component;
a magnetic metal powder; and
fibrous heat conductive fillers,
wherein 90% or more of the fibrous heat conductive fillers are oriented in one direction,
an angle of an orientation direction of the oriented fillers relative to an extending direction of a sheet surface is in the range of 0° to 30°, and
the electromagnetic wave absorbing heat conductive sheet satisfies condition of (a), (b) or (c):
(a) a heat conductivity in thickness direction of 1.5 W/(m·K) or more and a transmission absorption rate of the electromagnetic wave at 1 GHz of 4.8% or more,
(b) a heat conductivity in thickness direction of 1.5 W/(m·K) or more and a transmission absorption rate of the electromagnetic wave at 3 GHz of 68% or more,
(c) a heat conductivity in thickness direction of 1.5 W/(m·K) or more and a transmission absorption rate of the electromagnetic wave at 6 GHz of 70% or more.

14. A method for producing the electromagnetic wave absorbing heat conductive sheet according to claim 13 comprising:
preparing a sheet composition which comprises the polymer matrix component, the fibrous heat conductive fillers, and the magnetic metal powder;
orientating 90% or more of the fibrous heat conductive fillers in one direction;
producing a molded article for sheet by curing the polymer matrix component while keeping the fibrous heat conductive fillers oriented; and
producing an electromagnetic wave absorbing heat conductive sheet by cutting the molded article for sheet at an angle of 0° to 30° relative to a longitudinal axis of the fibrous heat conductive fillers oriented.

15. A semiconductor device, comprising:
a heat source;
a heat dissipation member; and
an electromagnetic wave absorbing heat conductive sheet held between the heat source and the heat dissipation member,
wherein the electromagnetic wave absorbing heat conductive sheet is the electromagnetic wave absorbing heat conductive sheet according to claim 13.

* * * * *